(12) United States Patent
Horiuchi et al.

(10) Patent No.: US 11,094,480 B2
(45) Date of Patent: Aug. 17, 2021

(54) KEYBOARD DEVICE

(71) Applicant: Chicony Electronics Co., Ltd., New Taipei (TW)

(72) Inventors: Mitsuo Horiuchi, New Taipei (TW); Chia-Hsin Chen, New Taipei (TW); Po-Hsin Li, New Taipei (TW)

(73) Assignee: CHICONY ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 16/739,566

(22) Filed: Jan. 10, 2020

(65) Prior Publication Data

US 2020/0402746 A1 Dec. 24, 2020

Related U.S. Application Data

(60) Provisional application No. 62/863,428, filed on Jun. 19, 2019.

(30) Foreign Application Priority Data

Aug. 19, 2019 (TW) ................................ 108129533

(51) Int. Cl.
*H01H 13/86* (2006.01)
*H01R 12/59* (2011.01)
(Continued)

(52) U.S. Cl.
CPC ........ *H01H 13/7065* (2013.01); *H01H 3/125* (2013.01); *H01H 13/14* (2013.01);
(Continued)

(58) Field of Classification Search
CPC .. H01H 13/81; H01H 13/86; H01H 2207/026; H01R 12/59; H05K 1/189; H05K 2201/10053; H05K 2201/10393
See application file for complete search history.

(56) References Cited

U.S. PATENT DOCUMENTS

| 4,028,509 | A | * | 6/1977 | Zurcher | ................. | G04C 3/005 |
| | | | | | | 200/5 A |
| 4,066,851 | A | * | 1/1978 | White | ................... | H01H 1/403 |
| | | | | | | 200/292 |

(Continued)

*Primary Examiner* — Jinhee J Lee
*Assistant Examiner* — Theron S Milliser
(74) *Attorney, Agent, or Firm* — Muncy, Geissler, Olds and Lowe, P.C.

(57) ABSTRACT

A keyboard device includes a substrate, a membrane circuit board, a flexible printed circuit board, a first fixing board, and a second fixing board. The substrate includes a top surface, a bottom surface, and a side edge. The substrate further includes an offset protrusion protruding from the top surface and forms a recessed area on the bottom surface. The membrane circuit board is disposed on the top surface. The membrane circuit board includes an outlet area correspondingly disposed on the offset protrusion. The flexible printed circuit board is disposed on the bottom surface. The flexible printed circuit board includes a fixed portion, a folded portion, and an electrical connection end. The fixed portion is received in the recessed area. The first fixing board is correspondingly disposed on the offset protrusion. The second fixing board is correspondingly received in the recessed area and assembled with the first fixing board.

10 Claims, 6 Drawing Sheets

(51) Int. Cl.
*H05K 1/18* (2006.01)
*H01H 13/7065* (2006.01)
*H01H 3/12* (2006.01)
*H01H 13/14* (2006.01)
*H01H 13/81* (2006.01)

(52) U.S. Cl.
CPC ............ *H01H 13/81* (2013.01); *H01H 13/86* (2013.01); *H01R 12/59* (2013.01); *H05K 1/189* (2013.01); *H01H 2207/026* (2013.01); *H01H 2231/002* (2013.01); *H05K 2201/10053* (2013.01); *H05K 2201/10393* (2013.01)

(56) References Cited

U.S. PATENT DOCUMENTS

| | | | | | |
|---|---|---|---|---|---|
| 4,128,744 | A | * | 12/1978 | Seeger | H01H 13/702 200/292 |
| 4,146,767 | A | * | 3/1979 | Murata | H01H 13/48 200/275 |
| 4,862,499 | A | * | 8/1989 | Jekot | H01H 13/702 379/368 |
| 4,892,981 | A | * | 1/1990 | Soloway | H01H 13/702 200/292 |
| 5,121,091 | A | * | 6/1992 | Fujiyama | H01H 13/702 335/1 |
| 5,144,567 | A | * | 9/1992 | Oelsch | G06F 3/0238 341/22 |
| 5,430,263 | A | * | 7/1995 | English | H01H 13/705 200/5 A |
| 5,610,799 | A | * | 3/1997 | Kato | H01L 23/24 174/252 |
| 6,215,418 | B1 | * | 4/2001 | Struthers | G06F 3/0238 341/22 |
| 6,222,525 | B1 | * | 4/2001 | Armstrong | G05G 9/04737 345/161 |
| 6,542,355 | B1 | * | 4/2003 | Huang | G06F 3/0202 312/223.2 |
| 6,633,241 | B2 | * | 10/2003 | Kaikuranta | H03K 17/98 341/20 |
| 6,903,794 | B2 | * | 6/2005 | Fukuta | G02F 1/13452 349/150 |
| 7,086,308 | B2 | * | 8/2006 | Suzuki | F16H 61/0006 307/10.1 |
| 7,146,721 | B2 | * | 12/2006 | Hunkeler | H05K 3/284 29/841 |
| 7,428,140 | B2 | * | 9/2008 | Yokote | G06F 1/1616 341/22 |
| 7,888,607 | B2 | * | 2/2011 | Lin | H05K 3/365 174/262 |
| 7,952,562 | B2 | * | 5/2011 | Mundt | G06F 1/169 345/168 |
| 8,576,209 | B2 | * | 11/2013 | Miyaguchi | G02F 1/1368 345/204 |
| 8,803,806 | B2 | * | 8/2014 | Mundt | G06F 1/1662 345/168 |
| 9,053,878 | B2 | * | 6/2015 | Kim | H04M 1/0274 |
| 9,129,762 | B2 | * | 9/2015 | Ohtaka | H01H 13/14 |
| 9,313,912 | B2 | * | 4/2016 | Abe | H05K 7/1417 |
| 2009/0128496 | A1 | * | 5/2009 | Huang | H01H 13/83 345/170 |
| 2011/0272262 | A1 | * | 11/2011 | Chen | H01H 13/83 200/5 A |
| 2011/0315580 | A1 | * | 12/2011 | Abe | H05K 5/006 206/320 |

* cited by examiner

KEYBOARD DEVICE

CROSS-REFERENCES TO RELATED APPLICATIONS

This application claims the priority benefit of U.S. provisional application Ser. No. 62/863,428, filed on Jun. 19, 2019 and Patent Application No. 108129533 filed in Taiwan, R.O.C. on Aug. 19, 2019. The entirety of the above-mentioned patent applications are hereby incorporated by references herein and made a part of the specification.

BACKGROUND

Technical Field

The instant disclosure relates to an input device, in particular, to a keyboard device.

Related Art

In recent years, switch devices, due to their small volumes, thin thicknesses, and lightweights, are widely utilized in different electronic devices (e.g., keyboards), in response to the "thin and light" trend in manufacturing products. In general, a membrane switch device is connected to the system circuit board of an electronic device through a flexible printed circuit (FPC) board for the signal transmission between the switch device and the system circuit board.

SUMMARY

A membrane circuit boards for keyboard known to the inventor(s) is disposed on a substrate, and after the flexible printed circuit board is connected to the membrane circuit board, the flexible printed circuit board is reversely folded and stacked on the bottom surface of the substrate, and then a fixing member is assembled on the bottom surface of the substrate to fix with the flexible printed circuit board. However, under such configuration, the button surface of the substrate will not be flat, and is not beneficial for the "thin and light" trend of the keyboard and also not beneficial for the assembly of other components on the bottom surface of the substrate.

In view of this, in one embodiment, a keyboard device is provided. The keyboard device comprises a substrate, a membrane circuit board, a flexible printed circuit board, a first fixing board, and a second fixing board. The substrate comprises a top surface, a bottom surface, and a side edge. The top surface and the bottom surface are respectively at two opposite surfaces of the substrate. The side edge is connected between the top surface and the bottom surface. The substrate further comprises an offset protrusion adjacently connected to the side edge. The offset protrusion protrudes from the top surface and forms a recessed area on the bottom surface. The membrane circuit board is disposed on the top surface of the substrate. The membrane circuit board comprises an outlet area correspondingly disposed on the offset protrusion. The membrane circuit board comprises a plurality of conductive wires extending to the outlet area. The flexible printed circuit board is disposed on the bottom surface of the substrate. The flexible printed circuit board comprises a fixed portion, a folded portion, and an electrical connection end. The fixed portion is received in the recessed area. The folded portion is connected between the fixed portion and the electrical connection end. The electrical connection end is extending to the offset protrusion and is electrically connected to the conductive wires. The first fixing board is correspondingly disposed on the offset protrusion. The second fixing board is correspondingly received in the recessed area. The second fixing board and the first fixing board are assembled and fixed with each other. Hence, the outlet area of the membrane circuit board and the electrical connection end of the flexible printed circuit board are pressed and fixed by the first fixing board, and the fixed portion of the flexible printed circuit board is pressed and fixed by the second fixing board.

As above, according to the keyboard device of one or some embodiments of the instant disclosure, the substrate has the offset protrusion such that the second fixing board can be received in the recessed area. Hence, the keyboard device can achieve the thin-and-light trend, and the bottom surface of the substrate can be flat for assembling with other components (e.g., backlight module) in a convenient manner.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
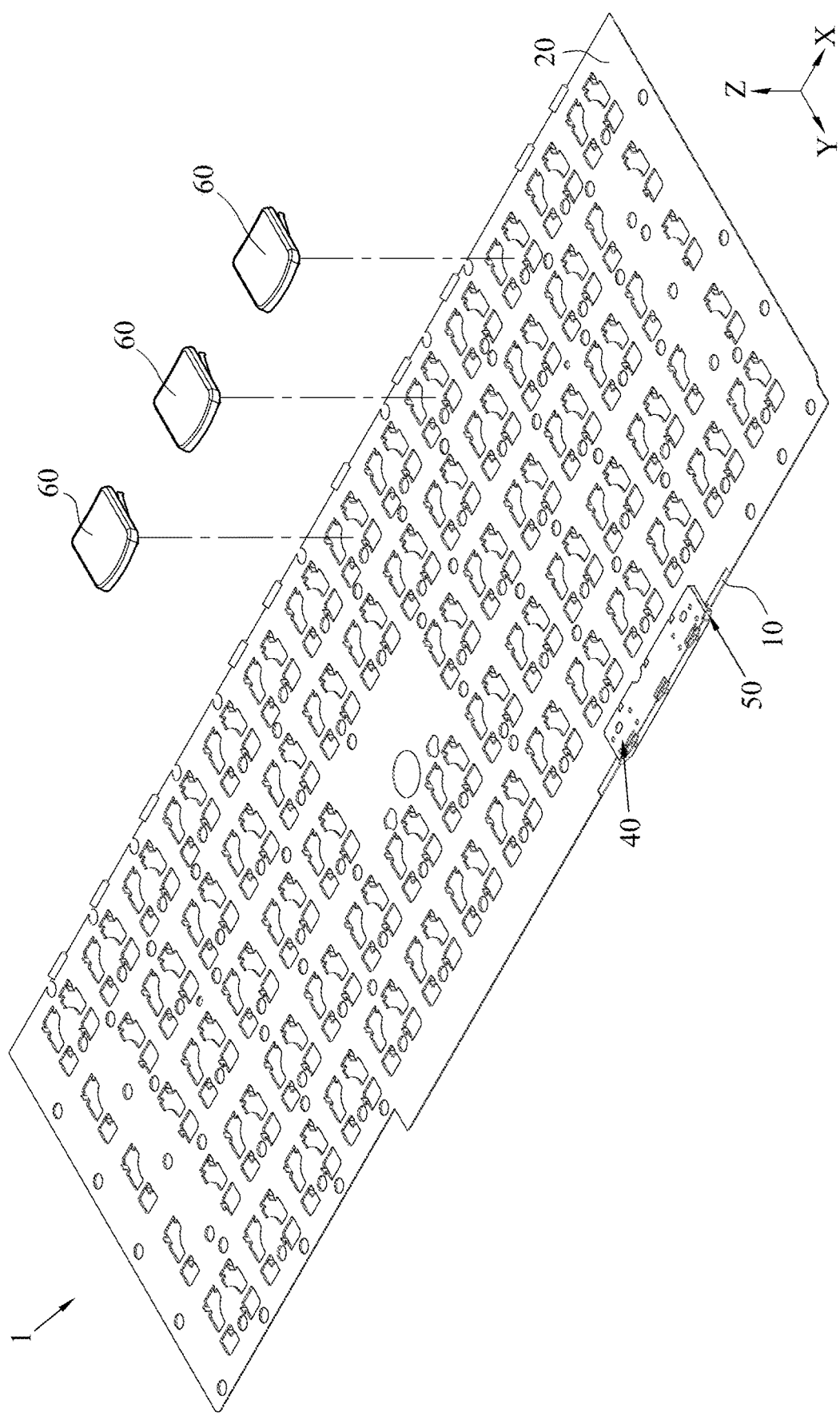
FIG. 1 illustrates an exploded view of a keyboard device according to an exemplary embodiment of the instant disclosure.
Figure 2:
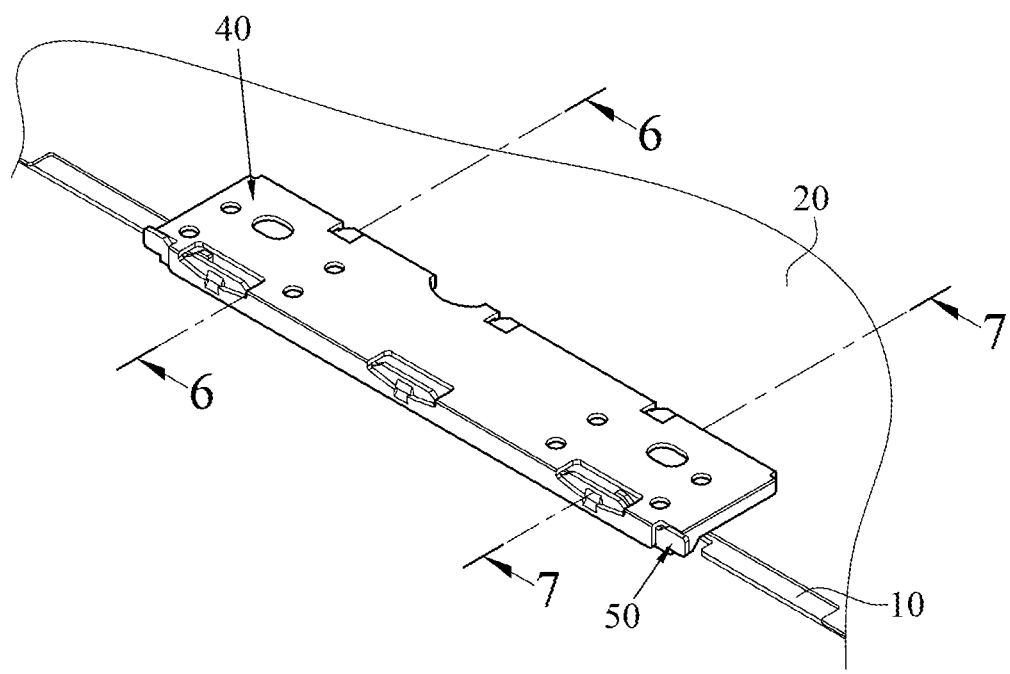
FIG. 2 illustrates an enlarged partial perspective view of the keyboard device of the exemplary embodiment.
Figure 3:
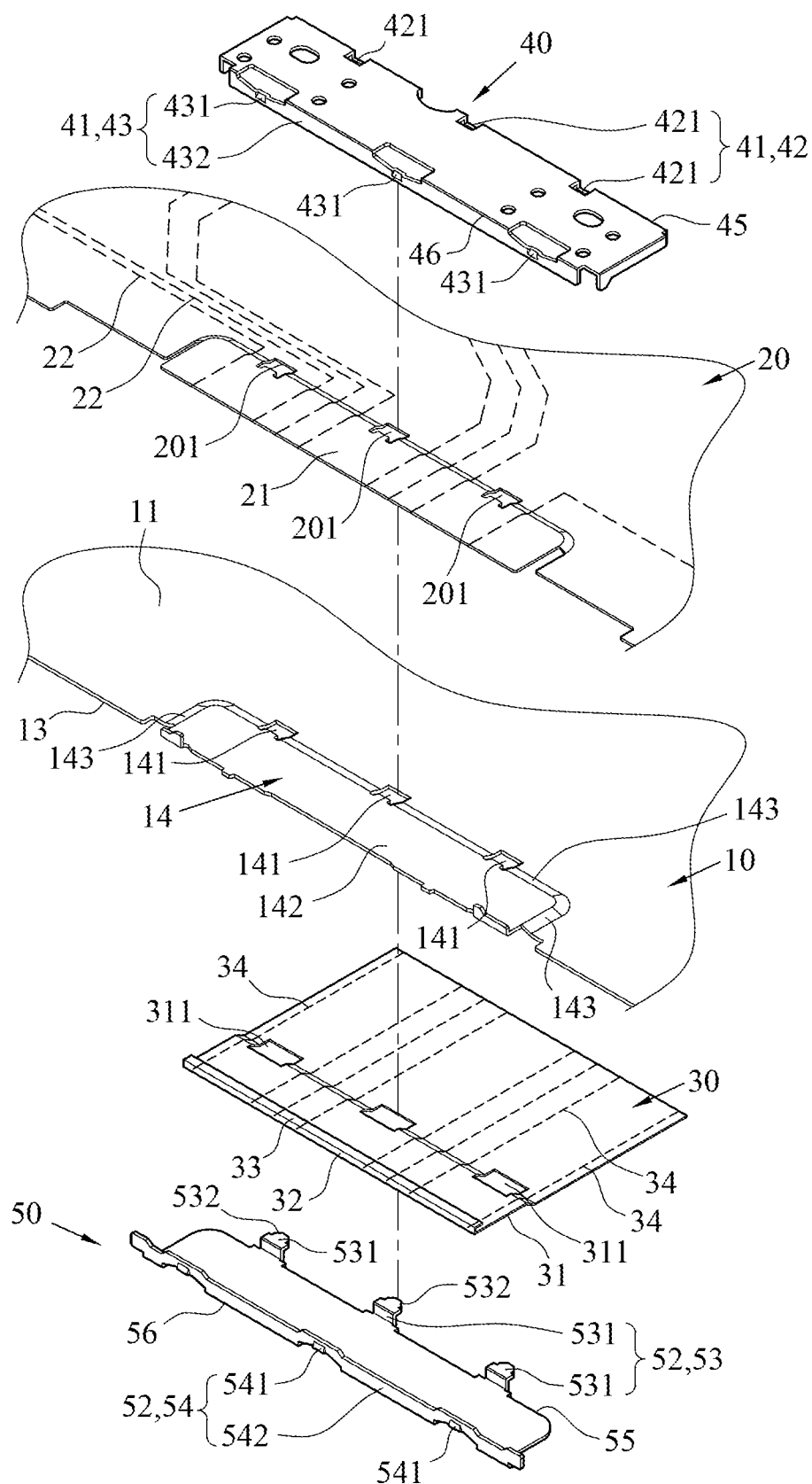
FIG. 3 illustrates an exploded view of the keyboard device shown in FIG. 2.
Figure 4:
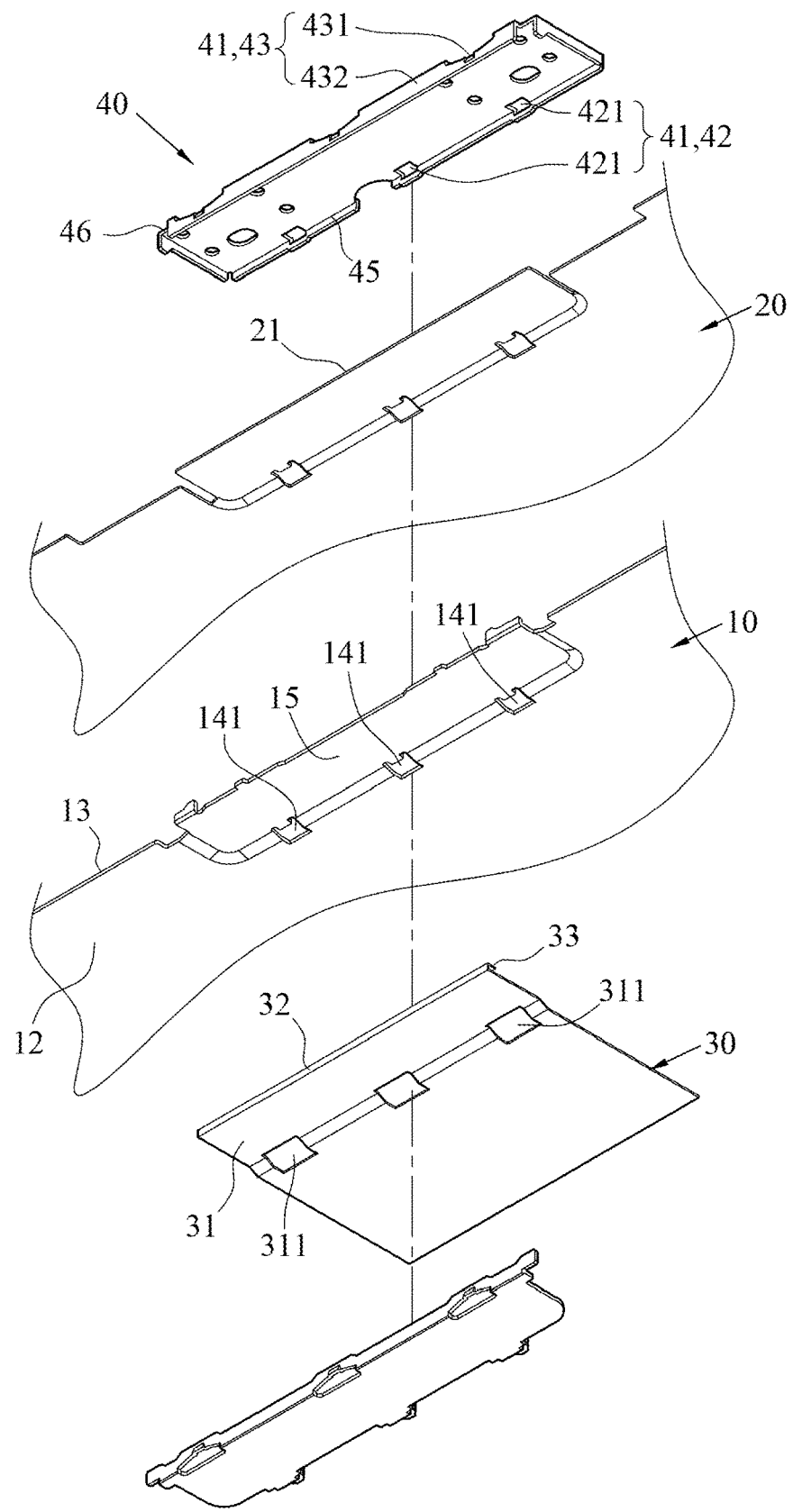
FIG. 4 illustrates a top exploded view of the keyboard device shown in FIG. 2.

FIG. 1 illustrates an exploded view of a keyboard device 1 according to an exemplary embodiment of the instant disclosure. FIG. 2 illustrates an enlarged partial perspective view of the keyboard device 1 of the exemplary embodiment. FIG. 3 illustrates an exploded view of the keyboard device 1 shown in FIG. 2. FIG. 4 illustrates a top exploded view of the keyboard device 1 shown in FIG. 2. As shown in FIGS. 1 to 3, in this embodiment, the keyboard device 1 comprises a substrate 10, a membrane circuit board 20, a flexible printed circuit board (FPC) 30, a first fixing board 40, and a second fixing board 50. The membrane circuit board 20 is disposed on the substrate 10, and the flexible printed circuit board 30 is adapted to be electrically connected to the membrane circuit board 20. The first fixing board 40 and the second fixing board 50 are adapted to fix the substrate 10, the membrane circuit board 20, and the flexible printed circuit board 30 with each other.

As shown in FIGS. 1 to 3, in this embodiment, the keyboard device 1 is a computer keyboard and has several keys 60. In this embodiment, three keys 60 are presented for illustrative purposes, but embodiments are not limited thereto. The keys 60 may comprise, for example, a plurality of alphabet keys, a plurality of number keys, a space key, an enter key, and a caps lock key. The keys 60 are pressably arranged on the membrane circuit board 20. For example, a resilient member (not shown) may be located between each of the keys 60 and the membrane circuit board 20, and the resilient member may be an elastic member or an elastic pin. Therefore, when the key 60 is pressed, the key 60 is moved toward the membrane circuit board 2 downwardly to trigger a signal and to compress the resilient member to store an elastic force. Conversely, when the key 60 is released, the key 60 is moved upwardly to the original position of the key 60 by the elastic force stored in the resilient member. In other embodiments, the keyboard device 1 may be the key sets of other electronic devices, but embodiments are not limited thereto.

As shown in FIGS. 1 to 3, in some embodiments, the substrate 10 may be a rigid plate made of metal (e.g., iron, aluminum, alloy, etc.), or plastic materials for providing a supporting function. The substrate 10 has a top surface 11, a bottom surface 12, and a side edge 13. The top surface 11 and the bottom surface 12 are respectively at two opposite surfaces of the substrate 10, and the keys 60 are arranged on the top surface 11, so that a user can press the keys 60 for operation. The side edge 13 is one of the edges of the substrate 10 and is connected between the top surface 11 and the bottom surface 12. Moreover, the substrate 10 comprises an offset protrusion 14 adjacent to the side edge 13, and the offset protrusion 14 protrudes from the top surface 11 and forms a recessed area 15 on the bottom surface 12. For example, in this embodiment, the offset protrusion 14 is formed by stamping the substrate 10 along a direction from the bottom surface 12 to the top surface 11, so that the offset protrusion 14 is a structure bent upwardly from the substrate 10 and integrally formed with the substrate 10. As shown in FIG. 3, in this embodiment, the offset protrusion 14 comprises a flat plate 142 and a plurality of bent portions 143. The position of the flat plate 142 is higher than the top surface 11 of the substrate 10, and the bent portions 143 are connected between other three edges of the plate body 141 different from the side edge 13 and the top surface 11 of the substrate 10. However, it is understood that, the manufacturing process for the offset protrusion 14 is provided for illustrative purposes, but not limitations to the instant disclosure. In some embodiments, the offset protrusion 14 may be integrally formed with the substrate 10 by other manufacturing techniques (e.g., injection molding).

As shown in FIGS. 1 to 3, the membrane circuit board 20 is disposed on the top surface 11 of the substrate 10, and the membrane circuit board 20 is provided with several conductive wires 22. When the key 60 is pressed, the corresponding signal is conducted by the conductive wire 22. The conductive wires 22 may be metal patterns, for example, copper patterns, silver paste patterns, or other metal patterns. However, the conductive wires 22 are not limited to metal patterns; the conductive wires 22 may be made of other conductive materials. In some embodiments, the conductive wires 22 may be formed on the membrane circuit board 20 by printing or etching.

As shown in FIG. 3, the membrane circuit board 20 comprises an outlet area 21. The outlet area 21 is a portion of the membrane circuit board 20 for electrically connected to the flexible printed circuit board 30. Hence, the membrane circuit board 20 can be electrically connected to a corresponding processing system (e.g., the motherboard of a computer) via the flexible printed circuit board 30, for signal transmission. The outlet area 21 of the membrane circuit board 20 corresponds to the offset protrusion 14, and the conductive wires 22 are further extending to the outlet area 21.

As shown in FIGS. 3 and 4, the flexible printed circuit board 30 is disposed on the bottom surface 12 of the substrate 10. In this embodiment, the flexible printed circuit board 30 is bar-shaped and comprises a fixed portion 31, a folded portion 32, and an electrical connection end 33. The fixed portion 31 is received in the recessed area 15 below the offset protrusion 14. The folded portion 32 is connected between the fixed portion 31 and the electrical connection end 33. The electrical connection end 33 is reversely folded by the folded portion 32 and extending upwardly above the offset protrusion 14. A plurality of electrical connection wires 34 is disposed on the flexible printed circuit board 30 and the electrical connection wires 34 are extending to the electrical connection end 33 (as shown in FIG. 3). For example, the electrical connection wires 34 may be metal patterns, such as copper patterns, silver paste patterns, or other metal patterns. However, the electrical connection wires 34 are not limited to metal patterns; the electrical connection wires 34 may be made of other conductive materials. The electrical connection end 33 of the flexible printed circuit board 30 and the outlet area 21 of the membrane circuit board 20 are in contact with each other, and the electrical connection wires 34 at the electrical connection end 33 are electrically connected to the conductive wires 22 at the outlet area 21. For example, the outlet area 21 may be stacked on the electrical connection end 33, so that the electrical connection wires 34 are electrically connected to the conductive wires 22.

Figure 6:
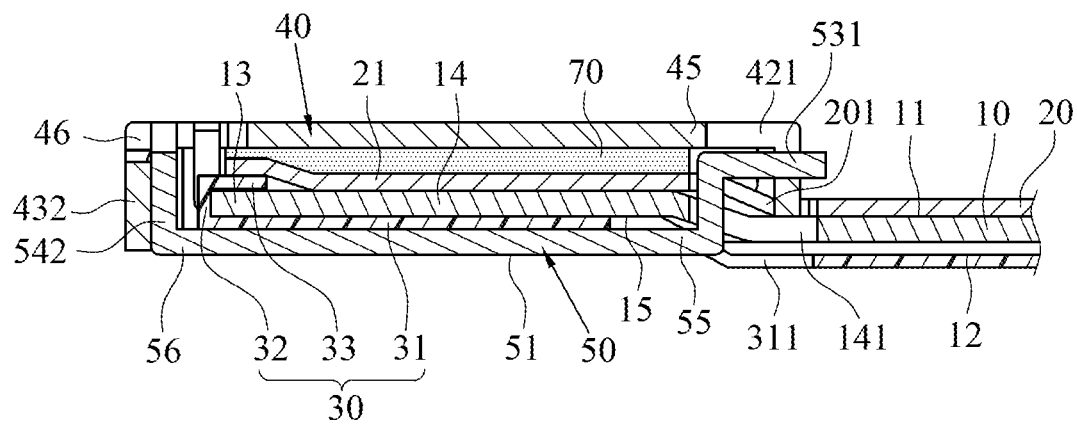
FIG. 6 illustrates a schematic assembled view of the first fixing board and the second fixing board of the keyboard device of the exemplary embodiment.

As shown in FIGS. 3, 4, and 6, where FIG. 6 illustrates a schematic assembled view of the first fixing board 40 and the second fixing board 50 of the keyboard device 1 according to an exemplary embodiment of the instant disclosure, and FIG. 6 corresponds to the cross-section along line 6-6 shown in FIG. 2. In this embodiment, the first fixing board 40 is disposed on the offset protrusion 14, and the second fixing board 50 is received in the recessed area 15. The second fixing board 50 and the first fixing board 40 are assembled and fixed with each other, so that the outlet area 21 of the membrane circuit board 20 and the electrical connection end 33 of the flexible printed circuit board 30 are pressed and fixed by the first fixing board 40, and so that the fixed portion 31 of the flexible printed circuit board 30 is pressed and fixed by the second fixing board 50. In this embodiment, the first fixing board 30 is pressed downwardly to the outlet area 21 of the membrane circuit board 20 and the electrical connection end 33 of the flexible printed circuit board 30 by an elastic member 70. Hence, the use of the elastic member 70 prevents the manufacturing tolerance of the components from adversely affecting the performance of fixation. The second fixing board 50 is pressed upwardly to the fixed portion 31 of the flexible printed circuit board 30. Accordingly, the substrate 10, the membrane circuit board 20, and the flexible printed circuit board 30 can be fixed with each other. In this embodiment, the elastic member 70 is foam, but embodiments are not limited thereto. In some embodiments, the foam may be replaced, according to actual requirements, by other elastic structures, elastic components, or elastic materials.

Accordingly, since the second fixing board 50 is received in the recessed area 15, the keyboard device 1 can achieve the thin-and-light trend, and the bottom surface 12 of the substrate 10 can be flat for assembling with other components (e.g., backlight module) in a convenient manner. For example, in one embodiment, the lower surface 51 of the second fixing board 50 may be not protruding from the bottom surface 12 of the substrate 10. Alternatively, in one embodiment, the lower surface 51 of the second fixing board 50 and the bottom surface 12 of the substrate 10 may be aligned at a same plane (as shown in FIG. 6). In a further option, in one embodiment, the lower surface 51 of the second fixing board 50 may be not protruding from the bottom portion of the flexible printed circuit board 30, so that the bottom surface 12 of the substrate 10 can be flat.

In some embodiments, the first fixing board 40 and the second fixing board 50 may be assembled and fixed with each other themselves, without external fixing elements. As shown in FIGS. 3 and 4, in this embodiment, the first fixing board 40 has a first fixing structure 41, and the second fixing board 50 has a second fixing structure 52, and the first fixing board 40 and the second fixing board 50 are assembled and fixed with each other by the assembly and fixation between the first fixing structure 41 and the second fixing structures 52; embodiments are provided as below.

As shown in FIGS. 3 and 4, in this embodiment, the membrane circuit board 20 has several first through holes 201, the offset protrusion 14 has several second through holes 141, and the fixed portion 31 of the flexible printed circuit board 30 has several third through holes 311. In this embodiment, the number of the first through holes 201, the second through holes 141, and the third through holes 311, are respectively three, but embodiments are not limited thereto. Each of the first through holes 201, the corresponding second through hole 141, and the corresponding third through hole 311 are in communication with each other. In this embodiment, the first fixing structure 41 of the first fixing board 40 may be downwardly protruding out of the first through hole 201, the second through hole 141, and the third through hole 311 to assemble and fix with the second fixing structure 52. Alternatively, the second fixing structure 52 may be upwardly protruding out of the first through hole 201, the second through hole 141, and the third through hole 311 to assemble and fix with the first fixing structure 41. Hence, the first fixing board 40 and the second fixing board 50 can be fixed with each other without external fixing elements (e.g., screws or bolts). For example, the first fixing structure 41 and the second fixing structure 52 may be corresponding male and female buckles, magnetic elements, fitting components, or other mating structures. Alternatively, the first fixing structure 41 and the second fixing structure 51 may be fixed with each other by adhering, hot-melting, or other ways.

Further, as shown in FIGS. 2, 4, and 6. In this embodiment, the first fixing board 40 has a first inner side 45 and a first outer side 46 opposite to the first inner side 45. The first outer side 46 is extending out of the side edge 13 of the substrate 10, and the first inner side 45 is distant from the side edge 13 of the substrate 10 with respect to the first outer side 46; in other words, the distance between the first inner side 45 and the side edge 13 of the substrate 10 is greater than the distance between the first outer side 46 and the side edge 13 of the substrate 10. The first fixing structure 41 comprises a first inner-side assembling member 42 and a first outer-side assembling member 43. The first inner-side assembling member 42 is disposed at the first inner side 45, and the first outer-side assembling member 43 is disposed at the first outer side 46. Similarly, the second fixing board 50 has a second inner side 55 and a second outer side 56 opposite to the second inner side 55. The second outer side 56 is extending out of the side edge 13 of the substrate 10, and the second inner side 55 is distant from the side edge 13 of the substrate 10 with respect to the second outer side 56; in other words, the distance between the second inner side 55 and the side edge 13 of the substrate 10 is greater than the distance between the second outer side 56 and the side edge 13 of the substrate 10. The second fixing structure 52 comprises a second inner-side assembling member 53 and a second outer-side assembling member 54. The second inner-side assembling member 53 is disposed at the second inner side 55 and is upwardly protruding out of the first through hole 201, the second through hole 141, and the third through hole 311, so that the second inner-side assembling member 53 is assembled and fixed with the first inner-side assembling member 42. The second outer-side assembling member 45 is disposed at the second outer side 56 and is assembled and fixed with the first outer-side assembling member 43.

Figure 5:
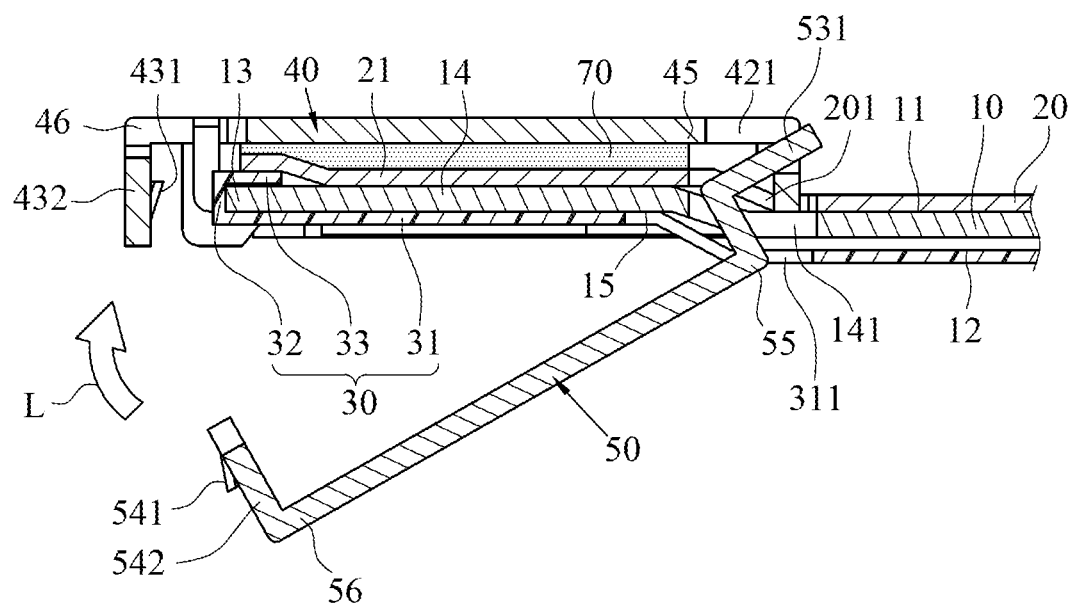
FIG. 5 illustrates a schematic view showing that a first fixing board and a second fixing board of the keyboard device are to be assembled with each other, according to the exemplary embodiment.

As above, as shown in FIGS. 2, 3, 5, and 6, where FIG. 5 illustrates a schematic view showing that the first fixing board 50 and the second fixing board 60 of the keyboard device 1 are to be assembled with each other, according to an exemplary embodiment of the instant disclosure. In this embodiment, the first inner-side assembling member 42 at the first inner side 45 of the first fixing board 40 comprises a plurality of hook grooves 421. Specifically, in this embodiment, the number of the hook grooves 421 is three, and the three hook grooves 421 are aligned along the first inner side 45. Further, in this embodiment, the second inner-side assembling member 53 at the second inner-side 55 of the second fixing board 50 comprises a plurality of hook plates 531. Specifically, in this embodiment, the number of the hook plates 531 is three, and the three hook plates 531 are aligned along the second inner side 55. The first outer-side assembling member 53 at the first outer side 46 of the first fixing board 40 comprises a plurality of first buckling members 431 and a first folded plate 432. In this embodiment, the first folded plate 432 is formed by bending the first outer side 46 of the first fixing board 40 downwardly, and the first buckling members 431 are protruding from an inner side of the first folded plate 432. Specifically, in this embodiment, the first buckling members 431 are bumps integrally formed on the first folded plate 432 by stamping techniques, but embodiments are not limited thereto. The second outer-side assembling member 54 at the second outer side 56 of the second fixing board 50 comprises a plurality of second buckling members 541 and a second folded plate 542. In this embodiment, the second folded plate 542 is formed by bending the second outer side 56 of the second fixing board 50 upwardly, and the second buckling members 541 are protruding from an outer side of the second folded plate 542. Specifically, in this embodiment, the second buckling members 541 are bumps integrally formed on the second folded plate 542 by stamping techniques, but embodiments are not limited thereto.

Figure 7:
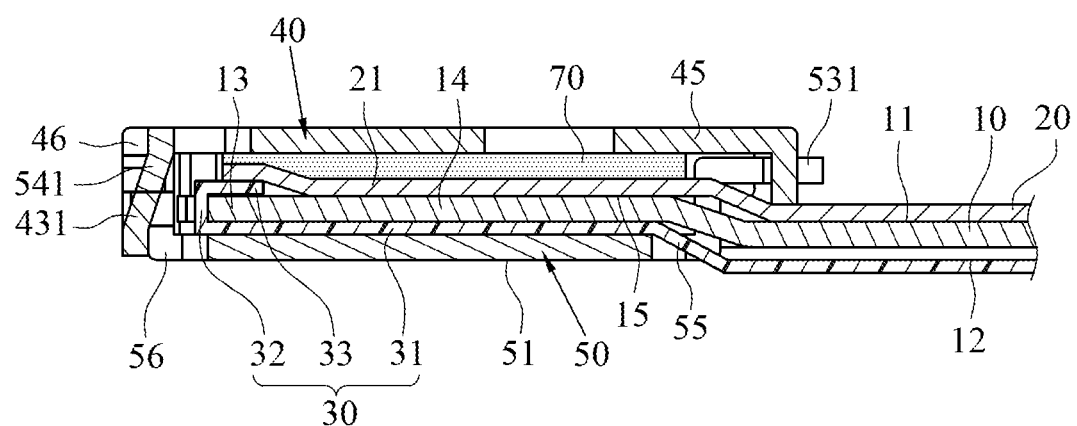
FIG. 7 illustrates a cross-sectional view showing that the first fixing board and the second fixing board of the keyboard device are buckled with each other, according to the exemplary embodiment.

As shown in FIG. 5, during the assembling process of the first fixing board 40 and the second fixing board 50, firstly the second inner side 55 of the second fixing board 50 is upwardly protruding out of the first through hole 201, the second through hole 141, and the third through hole 311. Further, the hook plates 531 of the second inner-side assembling member 53 are inserted into and engaged with the hook grooves 421 of the first inner-side assembling member 42, respectively. As shown in FIG. 3, in this embodiment, an end portion of each of the hook plates 531 of the second inner-side assembling member 53 further comprises an inclined guiding surface 532. Therefore, when the hook plate 531 is to be inserted into the hook groove 421, the insertion of the hook plate 531 can be guided by the inclined guiding surface 532 to reduce the mechanical interference during the insertion process. Next, the first outer side 46 of the first fixing board 40 and the second outer side 56 of the second fixing board 50 may be swung toward each other (as indicated by the arrow L shown in FIG. 5). Thus, the first buckling members 431 of the first fixing board 40 and the second buckling members 541 of the second fixing board 50 can be buckled and fixed with each other, as shown in FIGS. 6 and 7. Please refer to FIG. 7, where FIG. 7 illustrates a cross-sectional view showing that the first fixing board 40 and the second fixing board 50 of the keyboard device 1 are buckled with each other, according to an exemplary embodiment of the instant disclosure, and FIG. 7 corresponds to the cross-section along line 7-7 shown in FIG. 2. In this embodiment, during the process where the second outer side 56 of the second fixing board 50 is moved toward the first outer side 46 of the first fixing board 40, firstly the second buckling member 541 abuts against the first buckling member 431. Next, when the second outer side 56 of the second fixing board 50 is forced continuously to move upwardly, the second buckling member 541 then come across the first buckling member 431 and buckles with the first buckling member 431. Hence, the first folded plate 432 of the first fixing board 40 and the second folded plate 542 of the second fixing board 50 can be stacked with each other, so that the first fixing board 40 and the second fixing board 50 can be assembled and fixed with each other for the fixation of the substrate 10, the membrane circuit board 20, and the flexible printed circuit board 30.

As above, according to the keyboard device of one or some embodiments of the instant disclosure, the substrate 10 has the offset protrusion 14 such that the second fixing board 50 can be received in the recessed area 14. Hence, the keyboard device 1 can achieve the thin-and-light trend, and the bottom surface 12 of the substrate 10 can be flat for assembling with other components (e.g., backlight module) in a convenient manner.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A keyboard device comprising:
   a substrate comprising a top surface, a bottom surface, and a side edge, wherein the top surface and the bottom surface are respectively at two opposite surfaces of the substrate, and the side edge is connected between the top surface and the bottom surface; the substrate further comprises an offset protrusion adjacently connected to the side edge, the offset protrusion protrudes from the top surface and forms a recessed area on the bottom surface;
   a membrane circuit board disposed on the top surface of the substrate, wherein the membrane circuit board comprises an outlet area correspondingly disposed on the offset protrusion; the membrane circuit board comprises a plurality of conductive wires extending to the outlet area;
   a flexible printed circuit board disposed on the bottom surface of the substrate, wherein the flexible printed circuit board comprises a fixed portion, a folded portion, and an electrical connection end; the fixed portion is received in the recessed area, the folded portion is connected between the fixed portion and the electrical connection end, and the electrical connection end is extending to the offset protrusion and is electrically connected to the conductive wires;
   a first fixing board correspondingly disposed on the offset protrusion; and
   a second fixing board correspondingly received in the recessed area, wherein the second fixing board and the first fixing board are assembled and fixed with each other, so that the outlet area of the membrane circuit board and the electrical connection end of the flexible printed circuit board are pressed and fixed by the first fixing board, and so that the fixed portion of the flexible printed circuit board is pressed and fixed by the second fixing board.

2. The keyboard device according to claim 1, wherein the offset protrusion is a structure bent upwardly from the substrate and integrally formed with the substrate.

3. The keyboard device according to claim 1, wherein the second fixing board has a lower surface, and the lower surface and the bottom surface of the substrate are aligned at a same plane.

4. The keyboard device according to claim 1, wherein the first fixing board has a first fixing structure, the second fixing board has a second fixing structure, and the first fixing structure of the first fixing board and the second fixing structure of the second fixing board are assembled and fixed with each other.

5. The keyboard device according to claim 4, wherein the membrane circuit board has a first through hole, the offset protrusion has a second through hole, and the fixed portion of the flexible printed circuit board has a third through hole; the first through hole, the second through hole, and the third through hole are in communication with each other; the second fixing structure is upwardly protruding out of the first through hole, the second through hole, and the third through hole to assemble and fix with the first fixing structure.

6. The keyboard device according to claim 5, wherein the first fixing board has a first inner side and a first outer side opposite to the first inner side, and the first outer side is extending out of the side edge of the substrate; the first fixing structure comprises a first inner-side assembling member and a first outer-side assembling member, the first inner-side assembling member is disposed at the first inner side, and the first outer-side assembling member is disposed at the first outer side; the second fixing board has a second inner side and a second outer side opposite to the second inner side, and the second outer side is extending out of the side edge of the substrate; the second fixing structure comprises a second inner-side assembling member and a second outer-side assembling member, the second inner-side assembling member is disposed at the second inner side and is upwardly protruding out of the first through hole, the second through hole, and the third through hole, so that the second inner-side assembling member is assembled and fixed with the first inner-side assembling member, and the second outer-side assembling member is disposed at the second outer side and is assembled and fixed with the first outer-side assembling member.

7. The keyboard device according to claim 6, wherein the first outer-side assembling member comprises a first buckling member, the second outer-side assembling member comprises a second buckling member, the first buckling member and the second buckling member are buckled and fixed with each other.

8. The keyboard device according to claim 7, wherein the first outer-side assembling member comprises a first folded plate, and the first buckling member is protruding from an inner side of the first folded plate; the second outer-side assembling member comprises a second folded plate, and the second buckling member is protruding from an outer side of the second folded plate.

9. The keyboard device according to claim 6, wherein the first inner-side assembling member is a hook groove, and the second inner-side assembling member is a hook plate; the hook plate is upwardly protruding out of the first through hole, the second through hole, and the third through hole to be engaged and fixed in the hook groove.

10. The keyboard device according to claim 9, wherein an end portion of the hook plate further comprises an inclined guiding surface.

* * * * *